(12) United States Patent
Dörrie

(10) Patent No.: US 6,636,427 B2
(45) Date of Patent: Oct. 21, 2003

(54) HOUSING FOR AN INPUT UNIT

(75) Inventor: Christian Dörrie, Karlsruhe (DE)

(73) Assignee: Mannesmann VDO AG, Frankfurt (DE)

( * ) Notice: Subject to any disclaimer, the term of this patent is extended or adjusted under 35 U.S.C. 154(b) by 0 days.

(21) Appl. No.: 09/855,071

(22) Filed: May 14, 2001

(65) Prior Publication Data
US 2002/0015289 A1 Feb. 7, 2002

(30) Foreign Application Priority Data
May 18, 2000 (DE) .......................... 200 08 968

(51) Int. Cl.[7] .............................. H05K 5/02; H01H 9/02; H01H 13/02
(52) U.S. Cl. .................... 361/752; 174/50; 200/292; 200/294
(58) Field of Search ............................ 361/752, 755, 361/796, 814, 628; 200/292, 294, 296; 439/188, 488; 174/8, 50; 333/8; 29/8

(56) References Cited
U.S. PATENT DOCUMENTS

| | | | | |
|---|---|---|---|---|
| 5,491,614 A | * | 2/1996 | Fowler et al. | 361/784 |
| 5,535,095 A | * | 7/1996 | Slater et al. | 361/725 |
| 5,828,272 A | * | 10/1998 | Romerein et al. | 333/10 |
| 5,914,863 A | * | 6/1999 | Shen | 361/752 |
| 6,305,071 B1 | * | 10/2001 | Van Zeeland | 29/602 |
| 6,339,190 B1 | * | 1/2002 | Chung | 174/50 |
| 6,431,901 B1 | * | 8/2002 | Yeh | 439/357 |

* cited by examiner

Primary Examiner—David Martin
Assistant Examiner—Dameon E. Levi
(74) Attorney, Agent, or Firm—Jacob Eisenberg; Siemens Schweiz

(57) ABSTRACT

The housing, which is to accommodate a rotary switch arranged on a printed circuit board, is provided with a threaded projection which can be used to fasten it to a wall through which a setting stem, which is assigned to the rotary switch, reaches. The housing is designed in two parts in such a manner that one half (19, 20) of the threaded projection is integrally formed on each housing component (9, 10). The two housing components (9, 10) are joined together by means of latching connection means (11, 12, 13, 14) and hooks (one of which is denoted by 16) engaging in eyelets.

6 Claims, 3 Drawing Sheets

HOUSING FOR AN INPUT UNIT

BACKGROUND OF THE INVENTION

1. Field of the Invention

The invention relates to a housing for an input unit having a rotary switch which is arranged on a printed circuit board, having a setting stem which is assigned to the rotary switch and having a plug socket which is fastened on the printed circuit board, and also having means for fastening the input unit to a wall, with the setting stem reaching through the wall.

2. Description of the Prior Art

Input units of the abovementioned type, which are known per se, are provided with a thread which can be used to fasten it to, for example, a front wall of an appliance housing in such a manner that the setting stem, which is generally assigned an adjusting knob, reaches to the outside through the front wall. In such cases, i.e. in the case of a closed appliance, the inserted input unit is protected by the appliance housing from being accessed and against dirt, and does not require its own housing. An arrangement of the input unit directly on a dividing wall, for example on a dashboard of a motor vehicle, where the access on the rear side must be accessible for monitoring and repairing measures, renders it necessary to assign a protective housing to the input unit. In addition, this application requires the provision of a fastening which is suitable for the surroundings. That is to say, additional measures have to be taken in order to be able to install an input unit, which is ready for operation per se, in the motor vehicle independently of appliances or instrument carriers provided with housings.

The object of the present invention is therefore to house an input unit of the generic type in a manner which is secure against contact and dirt and with the smallest possible outlay on manufacture and installation in such a manner that the setting stem and the plug socket remain accessible, and problem-free installation of the input unit at the installation location and reliable fastening are ensured.

SUMMARY OF THE INVENTION

The object is achieved in that the housing has means for supporting the input unit, in that a threaded projection is formed on the housing and in that the fastening of the input unit takes place indirectly by screwing of the housing to the wall.

A preferred embodiment of the housing provides that the housing is designed in two parts in such a manner that one half of the threaded projection is integrally formed on each housing component.

The preferred exemplary embodiment is furthermore distinguished in that means for at least one bayonet-type connection are integrally formed on those walls of the housing components which face away from the threaded-projection halves, and means for at least one latching connection are integrally formed on the walls which are provided with the threaded-projection halves, in that the threaded-projection halves are designed as bearing shells which are assigned to the setting stem, and in that rib elements and slots serving as the mounting for the printed circuit board are provided on the housing components.

With the divided design of the threaded projection, the invention affords the advantage of only having to produce two housing halves which can be joined together without the use of a tool, have relatively rough tolerances and are not connected fixedly to each other until the input unit is fastened to a wall. In this arrangement, the latching connection means are formed on the flange side and the bayonet-type connection means are formed on that side of the housing which is opposite the flange side, which prevents damage-free intervention in the housing when it is fastened to the wall. It should also be mentioned here that instead of the bayonet-type connection means it is also possible to form a film hinge, with the advantage of avoiding any confusion between housing components or any positional corrections during installation of the housing. A further advantage of the design according to the invention can be seen in the fact that the threaded projection of the housing can be produced by injection molding and thus does not cause any additional outlay. Furthermore, the housing according to the invention provides the input unit with sufficient protection against dust, but in particular with secure gripping protection when it is being handled during installation.

It is also advantageous that the input unit is fastened indirectly by fastening of the housing in which it is mounted in an expedient manner. That is to say, a threaded projection can be formed on the housing, this projection providing flange-mounting conditions which are optimum as regards the security of the fastening.

BRIEF DESCRIPTION OF THE DRAWINGS

The invention will be explained in greater detail below with reference to drawings, in which.

DETAILED DESCRIPTION OF THE PREFERRED EMBODIMENT

Figure 1:
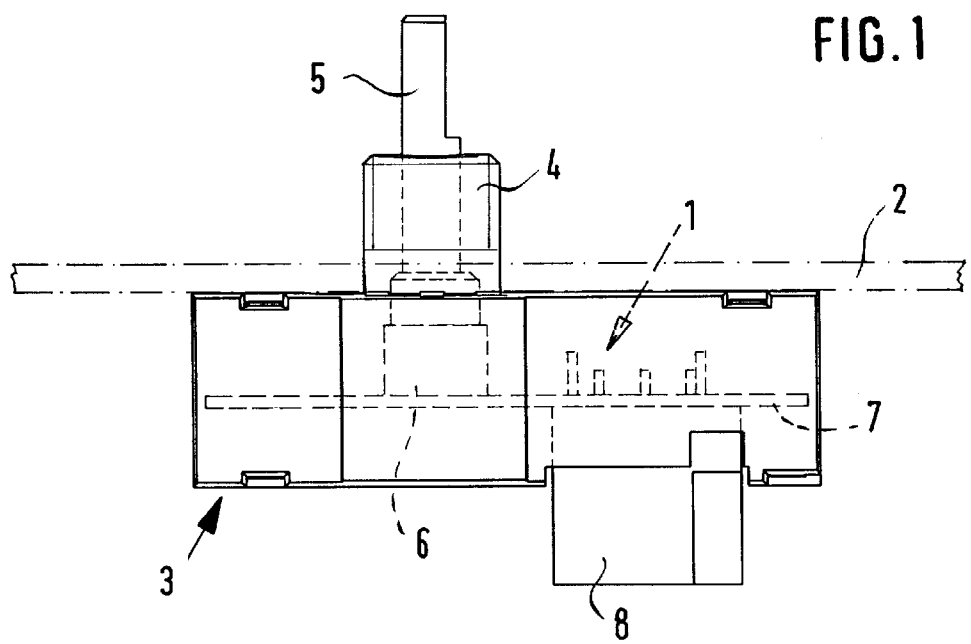
FIG. 1 shows a general illustration, specifically a side view of the housing with the input unit inserted.

The general illustration of FIG. 1 shows the housed input unit 1 in association with a wall 2. Means for fastening the input unit 1 to the wall 2, which are assigned to a threaded projection 4 integrally formed on the housing 3 and which are namely a washer and a nut, are not illustrated—because they are not essential to the invention. The same applies to an operating knob which is to be connected to a partially D-shaped setting stem 5 of the input unit 1.

For the sake of completeness, it should also be mentioned that the setting stem 5 is assigned to a rotary switch or to a switch 6 which can be actuated rotationally and axially, in which case the setting stem 5 may also be designed as a coaxial stem, for example. The rotary switch 6 is arranged on a printed circuit board 7 which supports a plug socket 8 and, at least, means for supplying power and processing signals.

Figure 2:
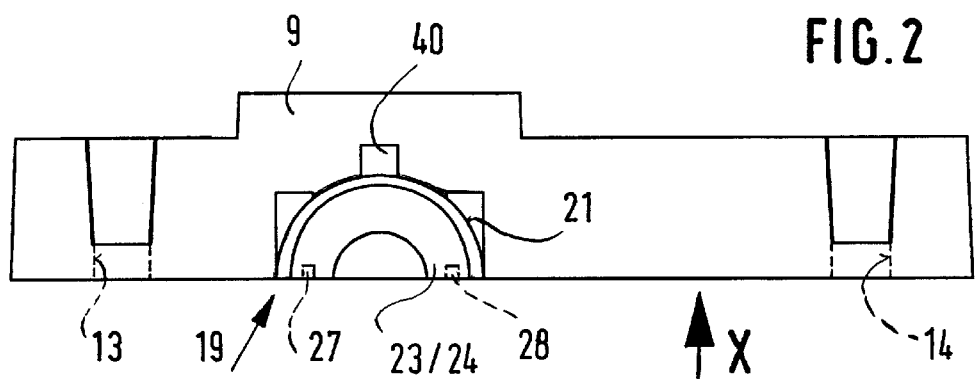
FIG. 2 shows a plan view of a first housing component.
Figure 3:
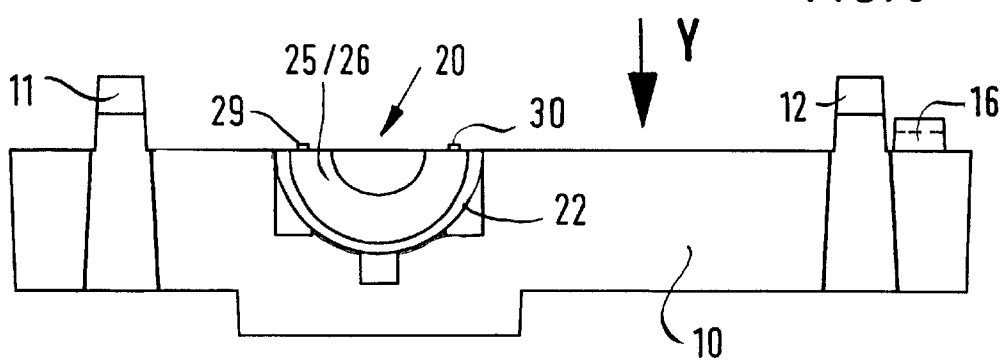
FIG. 3 shows a plan view of a second housing component.
Figure 4:
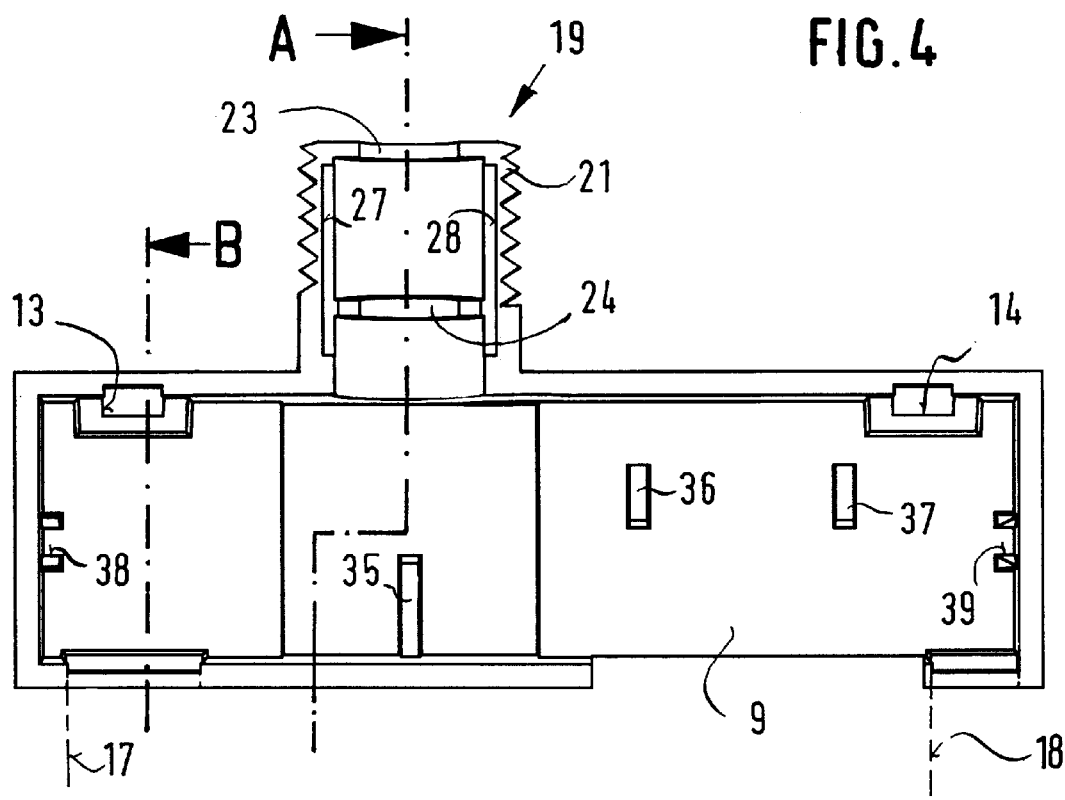
FIG. 4 shows an interior view of the first housing component according to the direction of projection X in FIG. 2.
Figure 5:
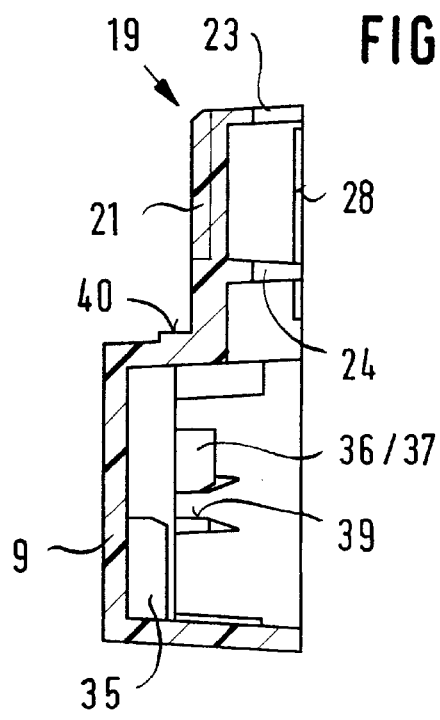
FIG. 5 shows a sectional illustration according to the line of intersection A in FIG. 4.
Figure 6:
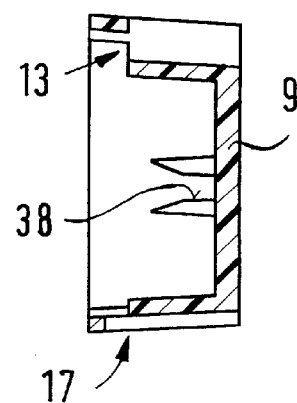
FIG. 6 shows a sectional illustration according to the line of intersection B in FIG. 4.
Figure 7:
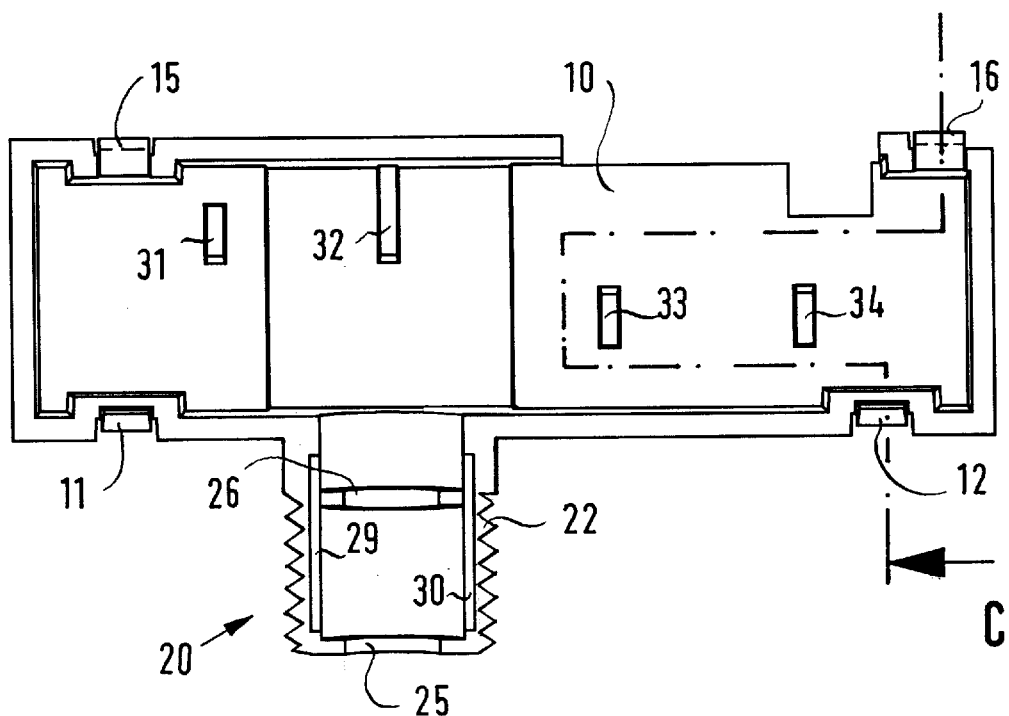
FIG. 7 shows an interior view of the second housing component according to the direction of projection Y in FIG. 3.
Figure 8:
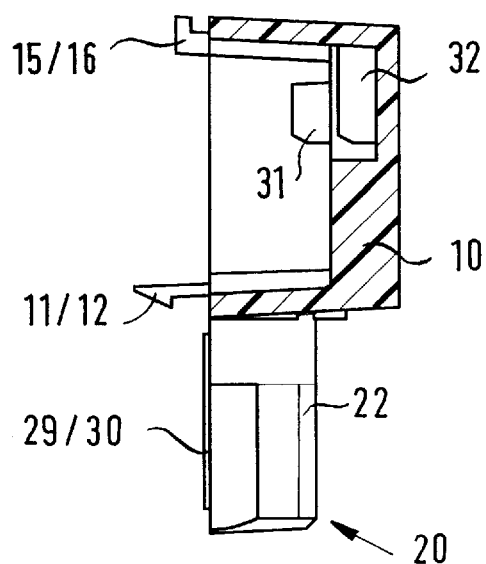
FIG. 8 shows a sectional illustration according to the line of intersection C in FIG. 7.

FIGS. 2 and 3 show the two housing components 9 and 10 of the housing 3 in a mutual association corresponding to the installation. In this case, during the joining-together of the housing components 9 and 10 first bayonet-type connection means and then latching connection means are brought into engagement. Latches 11 and 12 are integrally formed on the housing component 10 and apertures 13 and 14 are formed on the housing component 9 as the latching connection means. Hook 15 and hook 16 of the bayonet-type connection means are illustrated in FIG. 7. FIG. 4 shows eyelets 17 and 18 which are assigned to the hooks 15 and 16 (shown in FIG. 7) and are left open in the casting process.

As can also be seen from FIGS. 2 and 3 and constituting an essential feature of the invention is that threaded-projection halves 19 and 20 are integrally formed on each housing component 9, 10, specifically in such a manner that the respective partial threads 21 and 22 are designed such that they are offset with respect to each other by half a pitch. In addition, two respective annular segments 23, 24 and 25, 26 are formed within the threaded-projection halves 19, 20, which are formed with relatively thin walls for reasons to do with the injection molding, said annular segments forming a bearing for the setting stem 5 after the housing components 9, 10 have been joined together. Depressions which are made in the housing component 9 are denoted by 27 and 28. Strips 29 and 30 which are integrally formed on the housing component 10 correspond to said depressions. These joining elements enable the housing halves to be aligned directly on or within the threaded projection 4, with the result that the other connection means of the housing 3 can have relatively rough tolerances and only have to exert a clip-type function before the input unit 1 is installed on the wall 2. In other words, when the input unit 1 is fastened by means of the housing 3, the housing 3 is indirectly joined together.

Rib elements which are assigned to the printed circuit board 7 and are formed in alternating fashion in both housing components 9, 10 are used for mounting the input unit 1 within the housing 3 and also for supporting it when the rotary switch 6 is actuated. The rib elements which are provided in the housing component 10 are denoted by 31, 32, 33 and 34. The rib elements in the housing component 9 bear the reference numbers 35, 36 and 37. In addition, slots 38 and 39 are formed on the housing component 9 by means of ribs (not described in greater detail) and are used for the mounting of the printed circuit board 7. A plurality of flat sockets which surround the threaded projection 4 and of which one is denoted by 40 form a flange surface assigned to the housing 3.

What is claimed is:

1. A housing for an input unit having a rotary switch which is arranged on a printed circuit board, having a setting stem which is assigned to the rotary switch and having a plug socket which is fastened on the printed circuit board, and also having means for fastening the input unit to a wall, with the setting stem reaching through the wall, wherein the housing (3) has means for supporting the input unit (1), wherein a threaded projection (4) is formed on the housing (3), wherein the fastening of the input unit (1) takes place indirectly by screwing of the housing (3) to the wall (2), and wherein the threaded projection partially surrounds the setting stem (5).

2. The housing for an input unit as claimed in claim 1, wherein the housing (3) is designed in two parts (9, 10) in such a manner that one half (19, 20) of the threaded projection (4) is integrally formed on each housing part (9, 10).

3. The housing for an input unit as claimed in claim 2, wherein connecting means enabling the housing (3) to be joined together without the use of a tool are formed on the two housing parts (9, 10).

4. The housing for an input unit as claimed in claim 3, wherein means for at least one bayonet connection is integrally formed on those walls of the housing components (9, 10) which face away from the threaded-projection halves (19, 20), and means for at least one latching connection is integrally formed on the walls which are provided with the threaded-projection halves (19, 20).

5. The housing for an input unit as claimed in claim 1, wherein the threaded-projection comprises two halves (19, 20) designed as bearing shells and surrounding the setting stem (5).

6. The housing for an input unit as claimed in claim 1, wherein rib elements (31 to 37) and slots (38, 39) serving as the mounting for the printed circuit board (7) are provided on the housing parts (9, 10).

* * * * *